(12) United States Patent
Parmar et al.

(10) Patent No.: US 9,692,400 B2
(45) Date of Patent: Jun. 27, 2017

(54) PULSE WIDTH WIDENER AND A MEMORY SYSTEM INCLUDING THE SAME

(71) Applicant: SAMSUNG ELECTRONICS CO., LTD., Suwon-si, Gyeonggi-Do (KR)

(72) Inventors: Sunil Parmar, Suwon-si (KR); Han-Ki Jeoung, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/186,611

(22) Filed: Jun. 20, 2016

(65) Prior Publication Data

US 2017/0033779 A1    Feb. 2, 2017

(30) Foreign Application Priority Data

Jul. 29, 2015   (KR) .................. 10-2015-0106966

(51) Int. Cl.
| | | |
|---|---|---|
| *G11C 7/10* | (2006.01) | |
| *H03K 5/156* | (2006.01) | |
| *H03K 19/21* | (2006.01) | |
| *H03K 3/037* | (2006.01) | |
| *G11C 7/22* | (2006.01) | |
| *G11C 7/06* | (2006.01) | |

(52) U.S. Cl.
CPC ........... *H03K 5/1565* (2013.01); *G11C 7/062* (2013.01); *G11C 7/10* (2013.01); *G11C 7/22* (2013.01); *H03K 3/037* (2013.01); *H03K 19/21* (2013.01)

(58) Field of Classification Search
CPC .. G11C 7/22; G11C 7/062; G11C 7/10; G11C 7/1078; H03K 3/037; H03K 5/1565; H03K 19/21
USPC ................... 365/189.05, 194, 189.07, 233.1
See application file for complete search history.

(56) References Cited

U.S. PATENT DOCUMENTS

| | | | |
|---|---|---|---|
| 6,380,778 B2 | 4/2002 | Uehara et al. | |
| 8,076,964 B2 | 12/2011 | Lee et al. | |
| 8,803,578 B2 | 8/2014 | Ishii et al. | |
| 8,804,411 B1* | 8/2014 | Tedrow | G11C 13/0004 365/163 |
| 8,823,433 B2 | 9/2014 | Cha et al. | |
| 8,841,951 B2 | 9/2014 | Lee et al. | |
| 2014/0266362 A1 | 9/2014 | Lee et al. | |

FOREIGN PATENT DOCUMENTS

| | | |
|---|---|---|
| JP | 2001-223569 | 8/2001 |
| KR | 1020030084487 | 11/2003 |
| KR | 1020120068323 | 6/2012 |

* cited by examiner

*Primary Examiner* — David Lam
(74) *Attorney, Agent, or Firm* — F. Chau & Associates, LLC

(57) ABSTRACT

A pulse width widener includes a delay circuit, a processing circuit, and a latch circuit. The delay circuit generates a first signal by delaying an input signal including a first pulse by a delay time. The processing circuit generates a second signal, and the second signal includes information of a second pulse that is temporally extended from the first pulse when a width of the first pulse is smaller than the delay time, based on the first and second signals. The latch circuit stores the second signal and outputs the second pulse as an output signal.

19 Claims, 17 Drawing Sheets

PULSE WIDTH WIDENER AND A MEMORY SYSTEM INCLUDING THE SAME

CROSS-REFERENCE TO RELATED APPLICATION

This U.S. Non-provisional application claims priority under 35 USC §119 to Korean Patent Application No. 10-2015-0106966, filed on Jul. 29, 2015, in the Korean Intellectual Property Office (KIPO), the disclosure of which is incorporated by reference herein in its entirety.

TECHNICAL FIELD

An exemplary embodiment of the inventive concept relates generally to a pulse width widener, and more particularly to a pulse width widener that extends a pulse included in a signal.

DISCUSSION OF RELATED ART

Signal characteristics of data signals that are transferred through a channel according to a clock signal may deteriorate as the frequency of the clock signal increases. These signal characteristics of the data signal may be represented using an eye diagram. As the frequency of the clock signal increases, the eye in the eye diagram representing the transferred data signal may shrink and an error may occur when recovering the original data from the data signal.

SUMMARY

According to an exemplary embodiment of the inventive concept, a pulse width widener includes a delay circuit, a processing circuit, and a latch circuit. The delay circuit generates a first signal by delaying a first pulse of an input signal by a delay time. The processing circuit generates a second signal, and the second signal includes information of a second pulse that is temporally extended from the first pulse when a width of the first pulse is smaller than the delay time. The latch circuit stores the second signal and outputs the second pulse signal as an output signal.

In an exemplary embodiment of the inventive concept, a width of the second pulse may be substantially the same as the delay time.

In an exemplary embodiment of the inventive concept, the processing circuit may generate the second signal including information of a third pulse when the input signal includes the third pulse and a width of the third pulse is equal to or larger than the delay time.

In an exemplary embodiment of the inventive concept, the delay time may be fixed.

In an exemplary embodiment of the inventive concept, the delay time may be modified by a user.

In an exemplary embodiment of the inventive concept, the first pulse may be a portion of the input signal and the portion may be from a first time point of the input signal, at the first time point the input signal moves from an activation level to a deactivation level, to a second time point of the input signal, at the second time point the input signal moves from the deactivation level to the activation level after the width of the first pulse from the first time point.

In an exemplary embodiment of the inventive concept, the first pulse may be a portion of the input signal and the portion may be from a first time point of the input signal, at the first time point the input signal moves from a deactivation level to an activation level, to a second time point of the input signal, at the second time point the input signal moves from the activation level to the deactivation level after the width of the first pulse from the first time point.

In an exemplary embodiment of the inventive concept, the processing circuit may include a NMOS transistor and an exclusive NOR gate. A first input terminal of the exclusive NOR gate may receive the first signal, a second input terminal of the exclusive NOR gate may receive the second signal, and an output terminal of the exclusive NOR gate may output an enable signal. A source of the NMOS transistor may receive the input signal, a gate of the NMOS transistor may receive the enable signal, and a drain of the NMOS transistor may output the second signal.

In an example embodiment, the processing circuit may include a NMOS transistor, a PMOS transistor, an exclusive NOR gate, and an inverter. A first input terminal of the exclusive NOR gate may receive the first signal, a second input terminal of the exclusive NOR gate may receive the second signal, and an output terminal of the exclusive NOR gate may output an enable signal. An input terminal of the inverter may receive the enable signal and an output terminal of the inverter may output an inverted enable signal. The input signal may be provided to a first node. A source of the NMOS transistor may be connected to the first node, a gate of the NMOS transistor may receive the enable signal, and a drain of the NMOS transistor may be connected to a second node. A source of the PMOS transistor may be connected to the first node, a gate of the PMOS transistor may receive the inverted enable signal, and a drain of the PMOS transistor may be connected to the second node. The second signal may be outputted from the second node.

In an example embodiment, the processing circuit may include a PMOS transistor and an exclusive OR gate. A first input terminal of the exclusive OR gate may receive the first signal, a second input terminal of the exclusive OR gate may receive the second signal, and an output terminal of the exclusive OR gate may output an enable signal. A source of the PMOS transistor may receive the input signal, a gate of the PMOS transistor may receive the enable signal, and a drain of the PMOS transistor may output the second signal.

In an example embodiment, the processing circuit may include a NMOS transistor, a PMOS transistor, an exclusive OR gate, and an inverter. A first input terminal of the exclusive OR gate may receive the first signal. A second input terminal of the exclusive OR gate may receive the second signal, and an output terminal of the exclusive OR gate may output an enable signal. An input terminal of the inverter may receive the enable signal and an output terminal of the inverter may output an inverted enable signal. The input signal may be provided to a first node. A source of the PMOS transistor may be connected to the first node, a gate of the PMOS transistor may receive the enable signal, and a drain of the PMOS transistor may be connected to a second node. A source of the NMOS transistor may be connected to the first node, a gate of the NMOS transistor may receive the inverted enable signal, and a drain of the NMOS transistor may be connected to the second node. The second signal may be outputted from the second node.

In an example embodiment, the latch circuit may include a first inverter, a second inverter, and a third inverter. The second signal may be provided to a first node. An input terminal of the first inverter may be connected to the first node and an output terminal of the first inverter may be connected to a second node. An input terminal of the second inverter may be connected to the second node and an output terminal of the second inverter may be connected to the first node. An input terminal of the third inverter may be connected to the second node and an output terminal of the third inverter may output the output signal.

In an example embodiment, the latch circuit may include an inverter, a first NOR gate, and a second NOR gate. The second signal may be provided to a first node. An input terminal of the inverter may be connected to the first node and an output terminal of the inverter may be connected to a second node. A first input terminal of the first NOR gate may be connected to the second node, a second input terminal of the first NOR gate may be connected to a third node, and an output terminal of the first NOR gate may be connected to a fourth node. A first input terminal of the second NOR gate may be connected to the fourth node, a second input terminal of the second NOR gate may be connected to the first node, and an output terminal of the second NOR gate may be connected to the third node. The output signal may be outputted from the fourth node.

According to an exemplary embodiment of the inventive concept, a memory system includes a processor, a channel, and a memory device. The processor generates first through (N)-th signals. The channel includes signal lines that transfer the first through (N)-th signals. A first through (N)-th buffers receive the first through (N)-th signals as first through (N)-th received signals. The memory device includes the first through (N)-th buffers and a memory circuit. The first through (N)-th buffers generate first through (N)-th recovered signals respectively by comparing the first through (N)-th received signal and a reference voltage signal. The memory circuit operates based on the first through (N)-th recovered signals. N is a natural number greater than one. A (K)-th buffer includes a (K)-th comparator and a (K)-th pulse width widener. The (K)-th comparator generates a (K)-th compared output signal by comparing the (K)-th received signal and the reference voltage signal, the (K)-th compared output signal includes a pulse and the pulse has a width smaller than a delay time. The (K)-th pulse width widener generates the (K)-th recovered signal by extending the pulse. K is a natural number equal to or less than N.

In an exemplary embodiment of the inventive concept, the (K)-th pulse width widener includes a (K)-th delay circuit, a (K)-th processing circuit, and a (K)-th latch circuit. The (K)-th delay circuit may generate a first pulse signal by delaying the (K)-th compared output signal including a first pulse by the delay time. The (K)-th processing circuit may generate a second pulse signal, and the second pulse signal includes information of a second pulse that is temporally extended from the first pulse when a width of the first pulse is smaller than the delay time, based on the first and second pulse signals. The (K)-th latch circuit may store the second pulse signal. The latch circuit may output the second pulse as the (K)-th recovered signal.

According to an exemplary embodiment of the inventive concept, a memory system includes a processor, a first through (N)-th signal lines, a first through (N)-th buffers, and a memory circuit. The processor transmits the clock signal to a memory circuit. The first through (N)-th signal lines transfer a first through (N)-th signals from the processor to a first through (N)-th buffers. The first through (N)-th buffers generate a first through (N)-th recovered signals by comparing the first through (N)-th signals and a reference voltage. The memory circuit stores the first through (N)-th recovered signals in response to the clock signal. N is a natural number greater than 1. At least one of the first through (N)-th buffers may include a comparator and a pulse width widener. The comparator generates a compared output signal by comparing one of the first through (N)-th signals and the reference voltage signal, the compared output signal includes a pulse and the pulse has a width smaller than a delay time. The pulse width widener generates one of the first through (N)-th recovered signals by extending the pulse.

In an exemplary embodiment of the inventive concept, the pulse width widener may include a delay circuit, a processing circuit, and a storage circuit. The delay circuit may generate a first pulse signal by delaying the compared output signal including a first pulse by the delay time. The processing circuit may generate a second pulse signal, and the second pulse signal includes information of a second pulse that is temporally extended from the first pulse when a width of the first pulse is smaller than the delay time, in response to the first and second pulse signals. The storage circuit may store the second pulse signal, and may output the second pulse as an output signal.

In an exemplary embodiment of the inventive concept, the processor may generate a first through (M)-th delayed clock signals by delaying the clock signal by a first through (M)-th wait times and transmits the first through (M)-th delayed clock signals to the memory circuit. The processor may determine whether the first through (N)-th buffers recover valid first through (N)-th recovered signals when the memory circuit receives the first through (M)-th delayed clock signals. M is a natural number greater than 1.

In an exemplary embodiment of the inventive concept, the pulse width widener may be edge triggered.

BRIEF DESCRIPTION OF THE DRAWINGS

Exemplary embodiments of the inventive concept will be more clearly understood from the following detailed description taken in conjunction with the accompanying drawings.

DETAILED DESCRIPTION OF THE EMBODIMENTS

Figure 1:
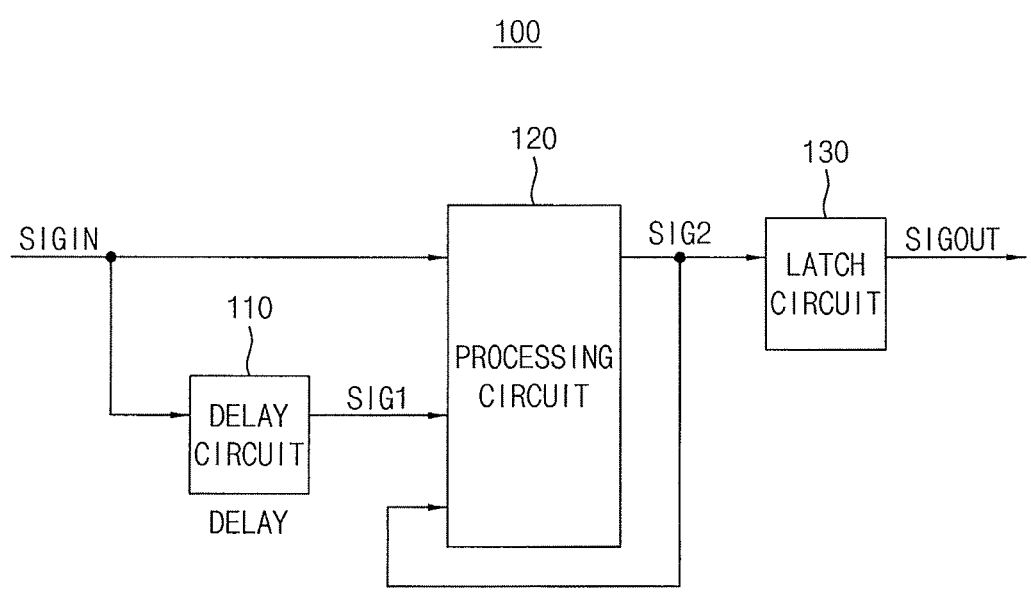
FIG. 1 is a block diagram illustrating a pulse width widener according to an exemplary embodiment of the inventive concept.

Various exemplary embodiments of the inventive concept will be described more fully hereinafter with reference to the accompanying drawings, in which some exemplary embodiments of the inventive concept are shown. An exemplary embodiment of the inventive concept may, however, be embodied in many different forms and may not be construed as limited to the exemplary embodiments of the inventive concept set forth herein. In the drawings, like numerals refer to like elements throughout.

It will be understood that, although the terms first, second, third etc. may be used herein to describe various elements, these elements may not be limited by these terms. These terms are used to distinguish one element from another. Thus, a first element discussed below could be termed a second element without departing from the teachings of the present inventive concept.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements may be interpreted in a like fashion (e.g., "between" versus "directly between," "adjacent" versus "directly adjacent," etc.).

The terminology used herein is for the purpose of describing exemplary embodiments of the inventive concept only and is not intended to be limiting. As used herein, the singular forms "a," "an" and "the" are intended to include the plural forms as well, unless the context clearly indicates otherwise.

In some exemplary embodiments of the inventive concept, a device, module or unit may be implemented in a circuit.

FIG. 1 is a block diagram illustrating a pulse width widener according to an exemplary embodiment of the inventive concept.

Referring to FIG. 1, a pulse width widener 100 includes a delay circuit 110, a processing circuit 120, and a latch circuit 130.

The delay circuit 110 generates a first signal SIG1 by delaying an input signal SIGIN including a first pulse by a delay time DELAY. The processing circuit 120 generates a second signal SIG2, which includes information of a second pulse that is temporally extended from the first pulse when a width of the first pulse is smaller than the delay time DELAY, based on the first and second signals SIG1 and SIG2. An exemplary embodiment of the processing circuit 120 will be described with respect to FIGS. 2 through 5. A further exemplary embodiment of the inventive concept, wherein the processing circuit 120 generates the second signal SIG2 when the width of the first pulse is smaller than the delay time DELAY will be described with respect to FIGS. 8 and 9.

The latch circuit 130 stores the second signal SIG2 and outputs the second pulse as an output signal SIGOUT. An exemplary embodiment of the latch circuit 130 will be described with respect to FIGS. 6 and 7.

In an exemplary embodiment of the inventive concept, the width of the second pulse may be substantially the same as the delay time DELAY.

In an exemplary embodiment of the inventive concept, the processing circuit 120 may generate the second signal SIG2 including information of a third pulse when the input signal SIGIN includes a third pulse and a width of the third pulse is equal to or larger than the delay time DELAY. In other words, the processing circuit 120 may output the third pulse in the second signal SIG2 without extending the third pulse. A further exemplary embodiment of the inventive concept, wherein the processing circuit 120 generates the second signal SIG2 when width of the third pulse is equal to or larger than the delay time DELAY will be described with respect to FIG. 10.

In an exemplary embodiment of the inventive concept, the delay time DELAY may be fixed. In an exemplary embodiment of the inventive concept, the delay time DELAY may be modified by a user before operation of the pulse width widener 100. In a further exemplary embodiment of the inventive concept, the delay time DELAY may be modified by a user during operation of the pulse width widener 100.

FIGS. 2 through 5 are circuit diagrams illustrating an exemplary embodiment of the processing circuit including the pulse width widener of FIG. 1. FIGS. 2 through 5 illustrate exemplary embodiments of the processing circuit 120. The processing circuit 120 may be implemented with other structures than the processing circuits 120A, 120B, 120C, and 120D of FIGS. 2 through 5.

Figure 2:
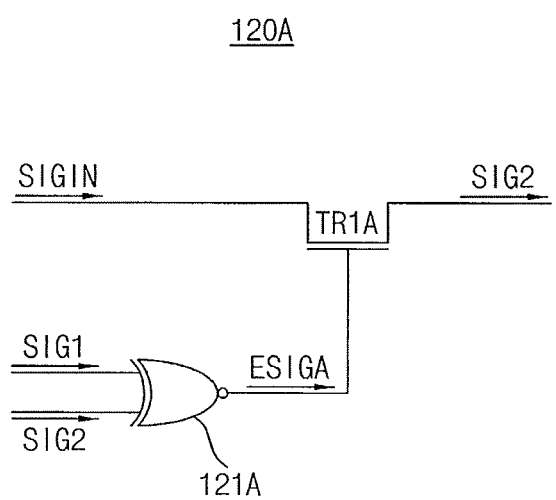
FIGS. 2 through 5 are circuit diagrams illustrating exemplary embodiments of the processing circuit including the pulse width widener of FIG. 1.

Referring to FIG. 2, the processing circuit 120A may include a NMOS transistor TR1A and an exclusive NOR gate 121A.

A first input terminal of the exclusive NOR gate 121A may receive the first signal SIG1. A second input terminal of the exclusive NOR gate 121A may receive the second signal SIG2. An output terminal of the exclusive NOR gate 121A may output an enable signal ESIGA. A source of the NMOS transistor TR1A may receive the input signal SIGIN. A gate of the NMOS transistor TR1A may receive the enable signal ESIGA. A drain of the NMOS transistor TR1A may output the second signal SIG2. An operation of the processing circuit 120A will be described with respect to FIGS. 8 through 10.

Figure 3:
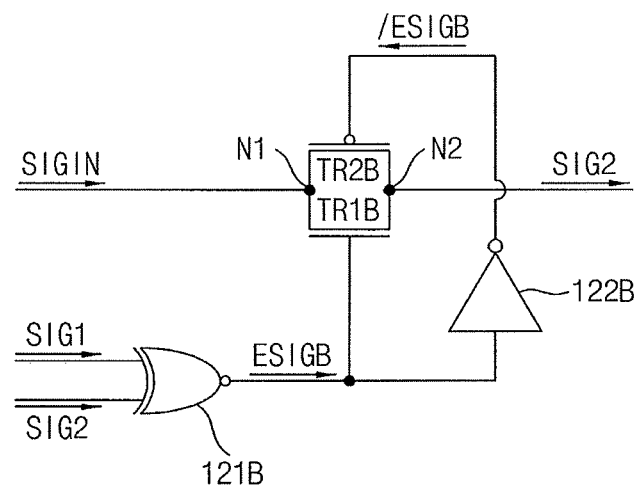

Referring to FIG. 3, the processing circuit 120B may include a NMOS transistor TR1B, a PMOS transistor TR2B, an exclusive NOR gate 121B, and an inverter 122B. The NMOS transistor TR1B and the PMOS transistor TR2B represent a normal pass transistor.

A first input terminal of the exclusive NOR gate 121B may receive the first signal SIG1. A second input terminal of the exclusive NOR gate 121B may receive the second signal SIG2. An output terminal of the exclusive NOR gate 121B may output an enable signal ESIGB. An input terminal of the inverter 122B may receive the enable signal ESIGB and an output terminal of the inverter 122B may output an inverted enable signal /ESIGB. The input signal SIGIN may be provided to a first node N1. A source of the NMOS transistor TR1B may be connected to the first node N1. A gate of the NMOS transistor TR1B may receive the enable signal ESIGB. A drain of the NMOS transistor TR1B may be connected to a second node N2. A source of the PMOS transistor TR2B may be connected to the first node N1. A gate of the PMOS transistor TR2B may receive the inverted enable signal /ESIGB. A drain of the PMOS transistor TR2B may be connected to the second node N2. The second signal SIG2 may be output from the second node N2.

Figure 4:
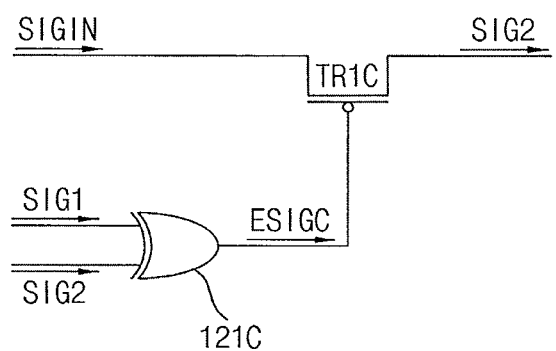

Referring to FIG. 4, the processing circuit 120C may include a PMOS transistor TR1C and an exclusive OR gate 121C.

A first input terminal of the exclusive OR gate 121C may receive the first signal SIG1. A second input terminal of the exclusive OR gate 121C may receive the second signal SIG2. An output terminal of the exclusive OR gate 121C may output an enable signal ESIGC. A source of the PMOS transistor TR1C may receive the input signal SIGIN. A gate of the PMOS transistor ESIGC may receive the enable signal ESIGC. A drain of the PMOS transistor TR1C may output the second signal SIG2.

Figure 5:
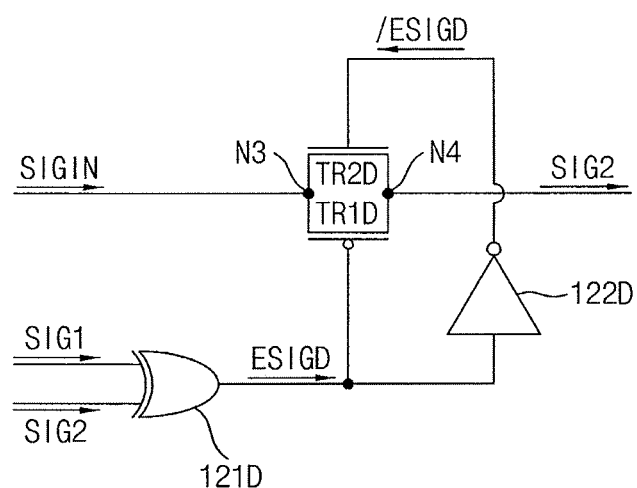

The processing circuit 120D illustrated in FIG. 5 may include a NMOS transistor TR1D, a PMOS transistor TR2D, an exclusive OR gate 121D, and an inverter 122D. The NMOS transistor TR1D and the PMOS transistor TR2D represent a normal pass transistor.

A first input terminal of the exclusive OR gate 121D may receive the first signal SIG1. A second input terminal of the exclusive OR gate 121D may receive the second signal SIG2. An output terminal of the exclusive OR gate 121D may output an enable signal ESIGD. An input terminal of the inverter 122D may receive the enable signal ESIGD and an output terminal of the inverter 122D may output an inverted enable signal /ESIGD. The input signal SIGIN may be provided to a third node N3. A source of the PMOS transistor TR1D may be connected to the third node N3. A gate of the PMOS transistor TR1D may receive the enable signal ESIGD. A drain of the PMOS transistor TR1D may be connected to a fourth node N4. A source of the NMOS transistor TR2D may be connected to the third node N3. A gate of the NMOS transistor TR2D may receive the inverted enable signal /ESIGD. A drain of the NMOS transistor TR2D may be connected to the fourth node N4. The second signal SIG2 may be outputted from the fourth node N4.

Figure 6:
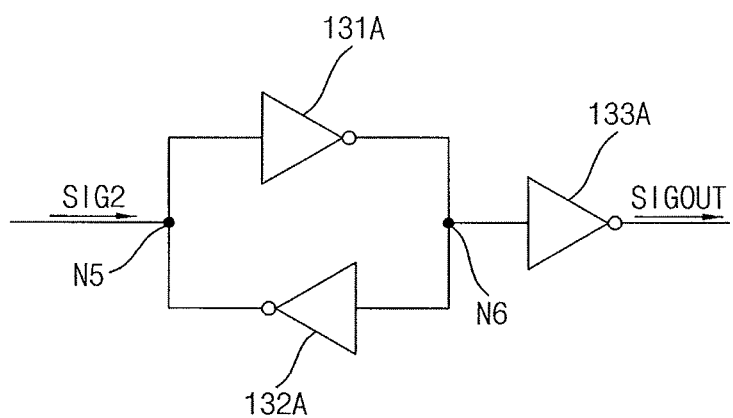
FIGS. 6 and 7 are circuit diagrams illustrating exemplary embodiments of a latch circuit included in the pulse width widener of FIG. 1.
Figure 7:
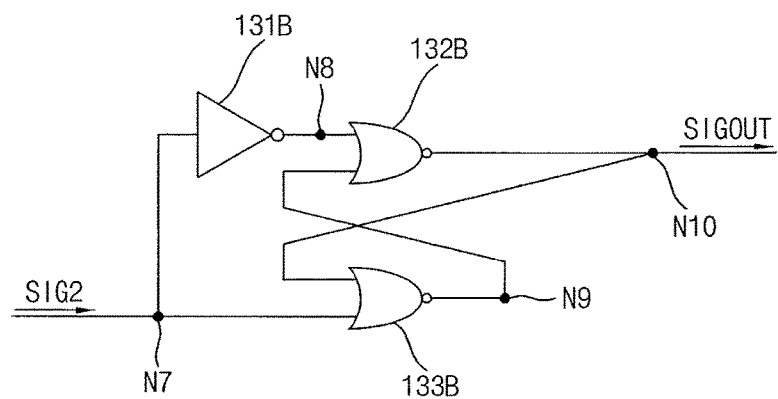

FIGS. 6 and 7 are circuit diagrams illustrating exemplary embodiments of the latch circuit included in the pulse width widener of FIG. 1. FIGS. 6 and 7 illustrate some example embodiments of the latch circuit 130. The latch circuit 130 may be implemented with other structures than the latch circuits 130A and 130B of FIGS. 6 and 7.

Referring to FIG. 6, the latch circuit 130A may include a first inverter 131A, a second inverter 132A, and a third inverter 133A.

The second signal SIG2 may be provided to a fifth node N5. An input terminal of the first inverter 131A may be connected to the fifth node N5 and an output terminal of the first inverter 131A may be connected to a sixth node N6. An input terminal of the second inverter 132A may be connected to the sixth node N6 and an output terminal of the second inverter 132A may be connected to the fifth node N5. An input terminal of the third inverter 133A may be connected to the sixth node N6 and an output terminal of the third inverter 133A may output the output signal SIGOUT.

The latch circuit 130A stores the second signal SIG2 and outputs the second pulse as the output signal SIGOUT.

Referring to FIG. 7, the latch circuit 130B may include an inverter 131B, a first NOR gate 132B, and a second NOR gate 133B.

The second signal SIG2 may be provided to a seventh node N7. An input terminal of the inverter 131B may be connected to the seventh node N7 and an output terminal of the inverter 131B may be connected to an eighth node N8. A first input terminal of the first NOR gate 132B may be connected to the eighth node N8. A second input terminal of the first NOR gate 132B may be connected to a ninth node N9. An output terminal of the first NOR gate 132B may be connected to a tenth node N10. A first input terminal of the second NOR gate 133B may be connected to the tenth node N10. A second input terminal of the second NOR gate 133B may be connected to the seventh node N7. An output terminal of the second NOR gate 133B may be connected to the ninth node N9. The output signal SIGOUT may be outputted from the tenth node N10.

The latch circuit 130B stores the second signal SIG2 and outputs the second pulse as the output signal SIGOUT.

Figure 8:
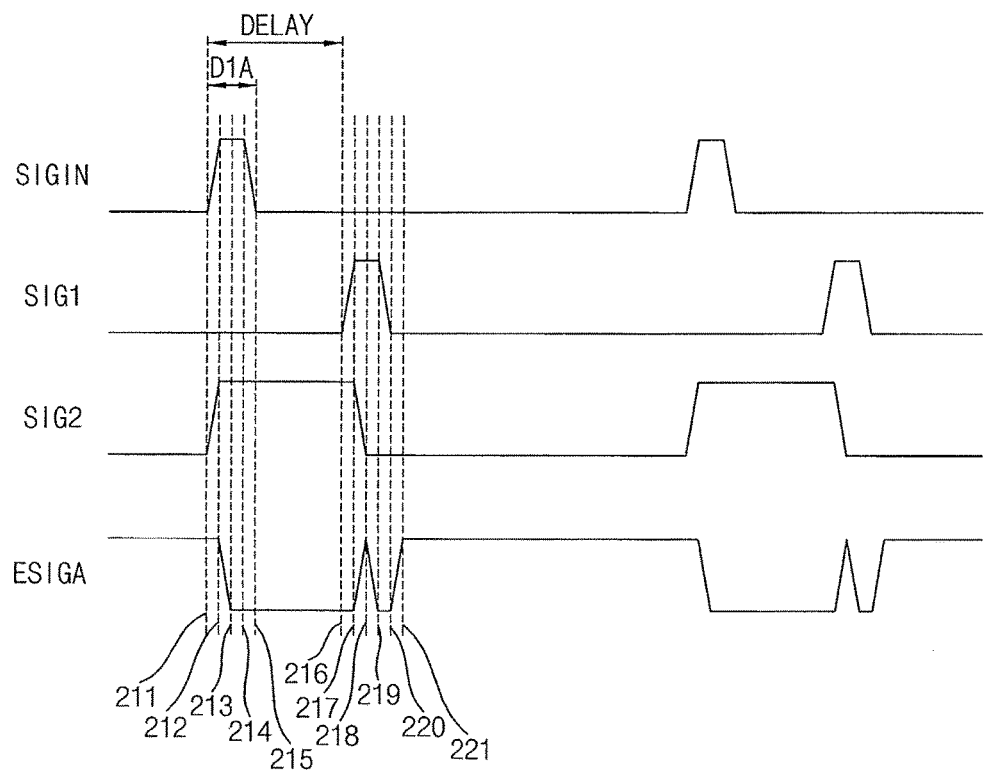
FIGS. 8 through 10 are timing diagrams illustrating an exemplary operation of the processing circuit of FIG. 2.
Figure 9:
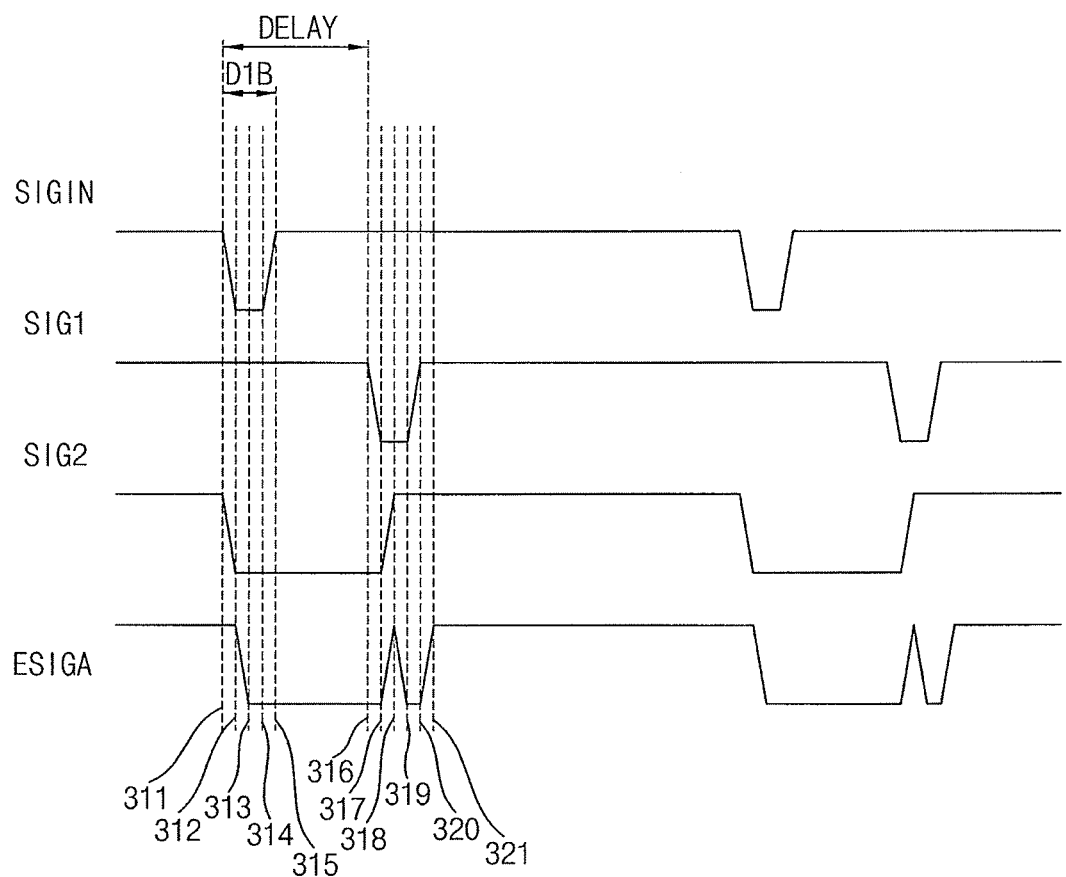
Figure 10:
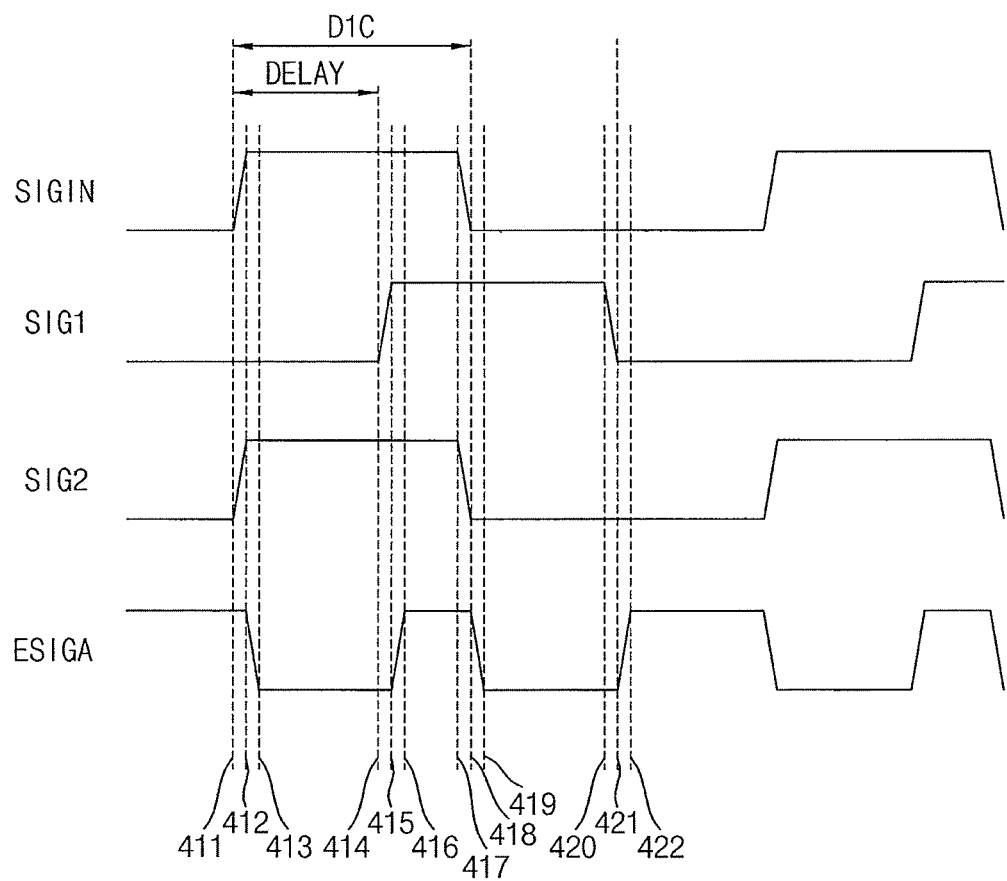

FIGS. 8 through 10 are timing diagrams illustrating the operation of the processing circuit of FIG. 2.

Referring to FIG. 8, the input signal SIGIN may include a first pulse which is denoted by a first time point 211 through fifth time point 215 during which the input signal SIGIN has an activation level. The first pulse 211~215 may be a portion of the input signal SIGIN. The first pulse 211~215 may extend from the first time point 211, at which the input signal SIGIN moves from a deactivation level to an activation level, to the fifth time point 215, at which the input signal SIGIN moves from the activation level to the deactivation level. The width D1A of the first pulse 211~215 extends from the first time point 211 to the fifth time point 215.

FIG. 8 shows a case that the width D1A of the first pulse 211~215 is smaller than the delay time DELAY of the delay circuit 110.

Because the enable signal ESIGA is activated at the first time point 211, the NMOS transistor TR1A is turned on and the second signal SIG2 is deactivated like the input signal SIGIN.

From the first time point 211 to the second time point 212, the second signal SIG2 is activated because the input signal SIGIN is activated and the NMOS transistor TR1A is turned on.

From the second time point 212 through the third time point 213, the delay circuit 110 outputs the deactivated first signal SIG1, the exclusive NOR gate 121A deactivates the enable signal ESIGA based on the deactivated first signal SIG1 and the activated second signal SIG2, and the NMOS transistor TR1A is turned off.

From the fourth time point 214 to the fifth time point 215, the input signal SIGIN is deactivated, the latch circuit 130 maintains the second signal SIG2 at the activation level, the delay circuit 110 outputs the deactivated first signal SIG1, the exclusive NOR gate 121A maintains the enable signal ESIGA at the deactivation level, and the NMOS transistor TR1A is maintained in a turned off state.

From the sixth time point 216 to the seventh time point 217, the first signal SIG1 is activated. From the seventh time point 217 to the eighth time point 218, the exclusive NOR gate 121A activates the enable signal ESIGA, the NMOS transistor TR1A is turned on, and the second signal SIG2 is deactivated like the input signal SIGIN because both the first signal SIG1 and the second signal SIG2 are activated at the seventh time point 217.

From the eighth time point 218 to the ninth time point 219, the exclusive NOR gate 121A deactivates the enable signal ESIGA, the NMOS transistor TR1A is turned off, and the latch circuit 130 maintains the second signal SIG2 at the deactivation level, because the first signal SIG1 is activated and the second signal SIG2 is deactivated at the eighth time point 218.

From the ninth time point 219 to the tenth time point 220, the first signal SIG1 is deactivated.

From the tenth time point 220 to the eleventh time point 221, the exclusive NOR gate 121A activates the enable signal ESIGA and the NMOS transistor TR1A is turned on because both the first signal SIG1 and the second signal SIG2 are deactivated at the tenth time point 220.

As a result, the second signal SIG2 which is the output signal SIGOUT of the processing circuit 120A, includes information of the second pulse, which is denoted by the first time point 211 through the eighth time point 218, during which the second signal SIG2 has an activation level. The second pulse 211~218 extends from the first pulse 211~215. The width of the second pulse 211~218 may be substantially the same as or similar to the delay time DELAY.

In an exemplary embodiment of the present invention, the operation of extending the pulse may be edge triggered. In an exemplary embodiment wherein the operation of extending the pulse may be edge triggered the operation can be performed based on falling edges of the clock signals or based on both rising and falling edges of the signals.

Referring to FIG. 9, the input signal SIGIN may include a first pulse which is denoted by a first time point 311 through fifth time point 315 during which the input signal SIGIN has a deactivation level. The first pulse 311~315 may extend from the first time point 311 at which the input signal SIGIN moves from the activation level to the deactivation level to the fifth time point 315 at which the input signal SIGIN moves from the deactivation level to the activation level.

FIG. 9 shows a case that the width D1B of the first pulse 311~315 is smaller than the delay time DELAY of the delay circuit 110.

The NMOS transistor TR1A is turned on and the second signal SIG2 is activated like the input signal SIGIN, because the enable signal ESIGA is activated at the first time point 311.

From the first time point 311 to the second time point 312, the second signal SIG2 is deactivated because the input signal SIGIN is deactivated and the NMOS transistor TR1A is turned on.

From the second time point 312 through the third time point 313, the delay circuit 110 outputs the activated first signal SIG1, the exclusive NOR gate 121A deactivates the enable signal ESIGA based on the activated first signal SIG1 and the deactivated second signal SIG2, and the NMOS transistor TR1A is turned off.

From the fourth time point 314 to the fifth time point 315, the input signal SIGIN is activated, the latch circuit 130 maintains the second signal SIG2 at the deactivation level, the delay circuit DU 110 outputs the activated first signal SIG1, the exclusive NOR gate 121A maintains the enable signal ESIGA as the deactivation level, and the NMOS transistor TR1A is maintained at turn off state.

From the sixth time point 316 to the seventh time point 317, the first signal SIG1 is deactivated.

From the seventh time point 317 to the eighth time point 318, the exclusive NOR gate 121A activates the enable signal ESIGA, the NMOS transistor TR1A is turned on, and the second signal SIG2 is activated like the input signal SIGIN because both the first signal SIG1 and the second signal SIG2 are deactivated at the seventh time point 317.

From the eighth time point 318 to the ninth time point 319, the exclusive NOR gate 121A deactivates the enable signal ESIGA, the NMOS transistor TR1A is turned off, and the latch circuit 130 maintains the second signal SIG2 as the activation level because the first signal SIG1 is deactivated and the second signal SIG2 is activated at the eighth time point 318.

From the ninth time point 319 to the tenth time point 320, the first signal SIG1 is activated.

From the tenth time point 320 to the eleventh time point 321, the exclusive NOR gate 121A activates the enable signal ESIGA and the NMOS transistor TR1A is turned on because both the first signal SIG1 and the second signal SIG2 are activated at the tenth time point 320.

As a result, the second signal SIG2 which is the output signal SIGOUT of the processing circuit 120A. The second signal SIG2 includes information of the second pulse, which is denoted by the first time point 311 through the eighth time point 318 during which the second signal SIG2 has a deactivation level. The second pulse extends from the first pulse 311~315. The width of the second pulse 311~318 may be substantially the same or similar to the delay time DELAY.

FIG. 10 shows a case that width D1C of the first pulse 411~418 is larger than the delay time DELAY of the delay circuit 110. The first pulse is denoted by the first time point 411 through the eighth time point 418 during which the input signal SIGIN has an activation level.

The NMOS transistor TR1A is turned on and the second signal SIG2 is deactivated like the input signal SIGIN because the enable signal ESIGA is activated at the first time point 411.

The second signal SIG2 is activated, because the input signal SIGIN is activated and NMOS transistor TR1A is turned on from the first time point 411 to the second time point 412. From the second time point 412 to the third time point 413, the exclusive NOR gate 121A deactivates the enable signal ESIGA and the NMOS transistor TR1A is turned off because the first signal SIG1 is deactivated and the second signal SIG2 is activated at the second time point 412.

From the fourth time point 414 to the fifth time point 415, the first signal SIG1 is activated. From the fifth time point 415 to the sixth time point 416, the exclusive NOR gate 121A activates the enable signal ESIGA, the NMOS transistor TR1A is turned on, and the second signal SIG2 is maintained at the activation level like the input signal SIGIN because both the first signal SIG1 and the second signal SIG2 are activated at the fifth time point 415.

From the seventh time point 417 to the eighth time point 418, the second signal SIG2 is deactivated, because the input signal SIGIN is deactivated and the NMOS transistor TR1A is turned on. From the eighth time point 418 to the ninth time point 419, the exclusive NOR gate 121A deactivates the enable signal ESIGA, the NMOS transistor TR1A is turned off, and the latch circuit 130 maintains the second signal SIG2 at the deactivation level because the first signal SIG1 is activated and the second signal SIG2 is deactivated at the eighth time point 418.

From the tenth time point 420 to the eleventh time point 421, the first signal SIG1 is deactivated. From the eleventh time point 421 to the twelfth time point 422, the exclusive NOR gate 121A activates the enable signal ESIGA, the NMOS transistor TR1A is turned on, and the second signal SIG2 is maintained at the deactivation level like the input signal SIGIN because both the first signal SIG1 and the second signal SIG2 are deactivated at the eleventh time point 421.

As a result, the second signal SIG2, which is the output signal SIGOUT, of the processing circuit 120A includes information of the second pulse which is denoted by the first time point 411 through the eighth time point 418 during which the second signal SIG2 has an activation level. The second pulse 411~418 has substantially the same width as the first pulse 411~418.

Figure 11:
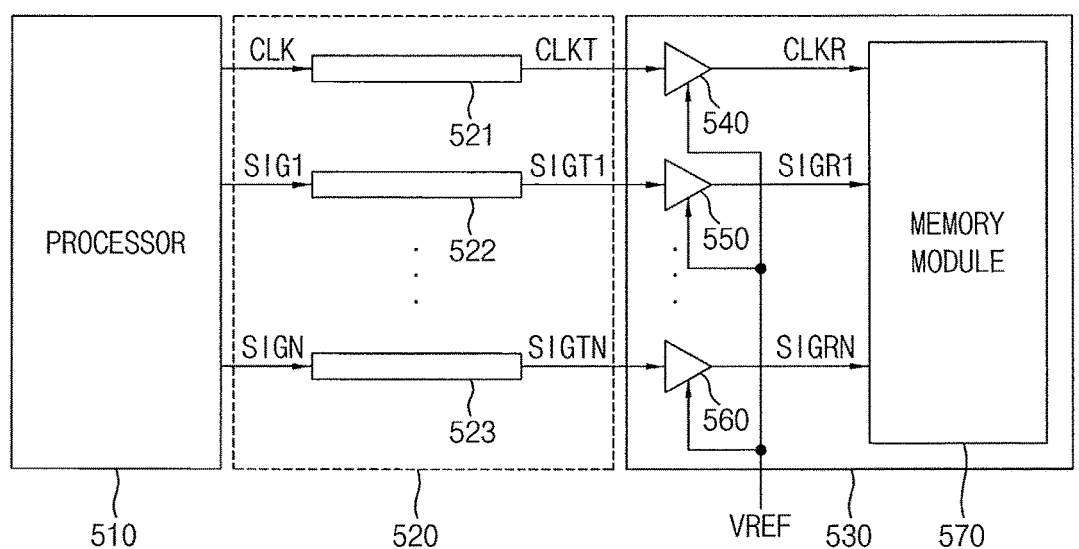
FIG. 11 is a block diagram illustrating a memory system according to an exemplary embodiment of the inventive concept.

FIG. 11 is a block diagram illustrating a memory system according to an exemplary embodiment of the inventive concept.

Referring to FIG. 11, the memory system 500 includes a processor 510, a channel 520, and a memory device 530. The channel 520 includes signal lines 521, 522, and 523. The memory device 530 includes buffers 540, 550, and 560 and a memory module 570.

The processor 510 generates first through (N)-th signals for the signal lines included in the channel. The clock signal line 521 transfers a clock signal CLK and the clock buffer 540 receives the transferred clock signal CLK as a received clock signal CLKT. The first signal line 522 transfers a first signal SIG1 and the first buffer 550 receives the transferred first signal SIG1 as a first received signal SIGT1. The (N)-th signal line 523 transfers a (N)-th signal SIGN and the (N)-th buffer 560 receives the transferred (N)-th signal SIGN as a (N)-th received signal SIGTN. The clock buffer 540 generates a recovered clock signal CLKR by recovering the received clock signal CLKT based on the reference voltage signal VREF. The first buffer 550 generates a first recovered signal SIGR1 by recovering the first received signal SIGT1 based on the reference voltage signal VREF. The (N)-th buffer 560 generates a (N)-th recovered signal SIGRN by recovering the (N)-th received signal SIGTN based on the reference voltage signal VREF. The memory module 570 operates based on the recovered signals CLKR, SIGR1 through SIGRN. The memory module 570 may store the data in the recovered signals SIGR1 through SIGRN.

Figure 12:
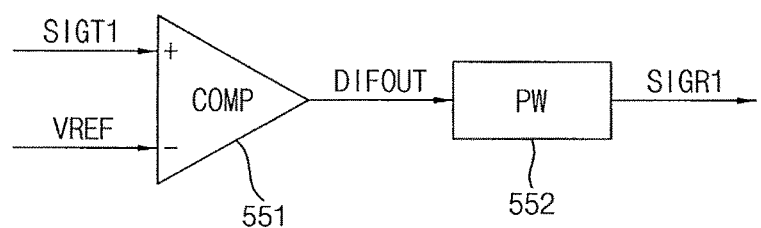
FIG. 12 is a block diagram illustrating a first buffer according to an exemplary embodiment of the inventive concept.

FIG. 12 is a block diagram illustrating an exemplary buffer included in the memory device of FIG. 11.

Referring to FIG. 12, the first buffer 550 includes a comparator 551 and a pulse width widener 552.

The comparator 551 generates a compared output signal DIFOUT by comparing the first received signal SIGT1 and the reference voltage signal VREF. The pulse width widener PW 552 generates the first recovered signal SIGR1 including an extended pulse extended from a pulse which is included in the compared output signal DIFOUT and has a width smaller than a delay time.

The pulse width widener 552 includes a delay circuit, a processing circuit, and a latch circuit. The delay circuit may generate a first signal by delaying the compared output signal DIFOUT including a first pulse by the delay time. The processing circuit may generate a second signal, which includes information of a second pulse that is temporally extended from the first pulse when width of the first pulse is smaller than the delay time, based on the first and second signals. The latch circuit may store the second signal. The latch circuit may output the second pulse as the first recovered signal.

In an exemplary embodiment of the inventive concept, the processing circuit may generate the second signal including information of a third pulse when the compared output signal DIFOUT includes the third pulse and width of the third pulse is substantially equal to or larger than the delay time.

The pulse width widener 552 may have substantially the same as or similar structure to the pulse width widener 100 of FIG. 1.

Figure 13:
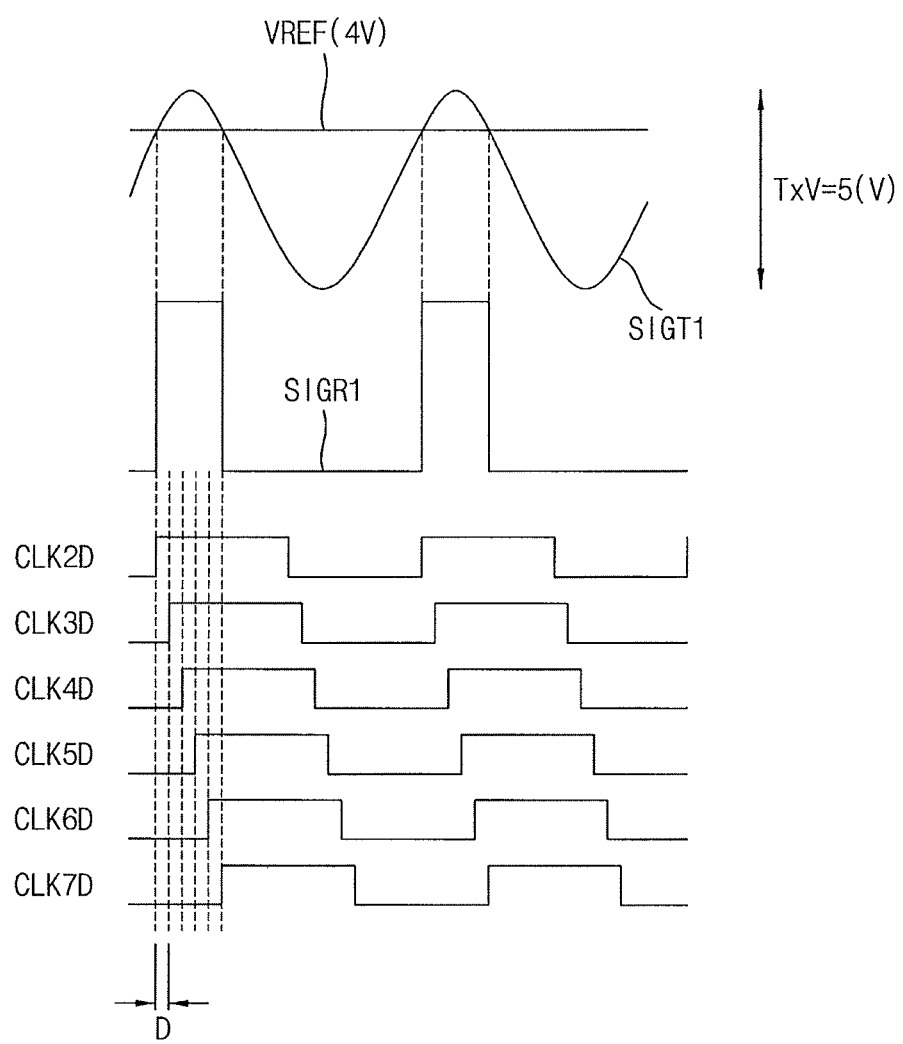
FIGS. 13 through 15 are diagrams illustrating an exemplary method of measuring signal characteristics of the memory system of FIG. 11.
Figure 14:
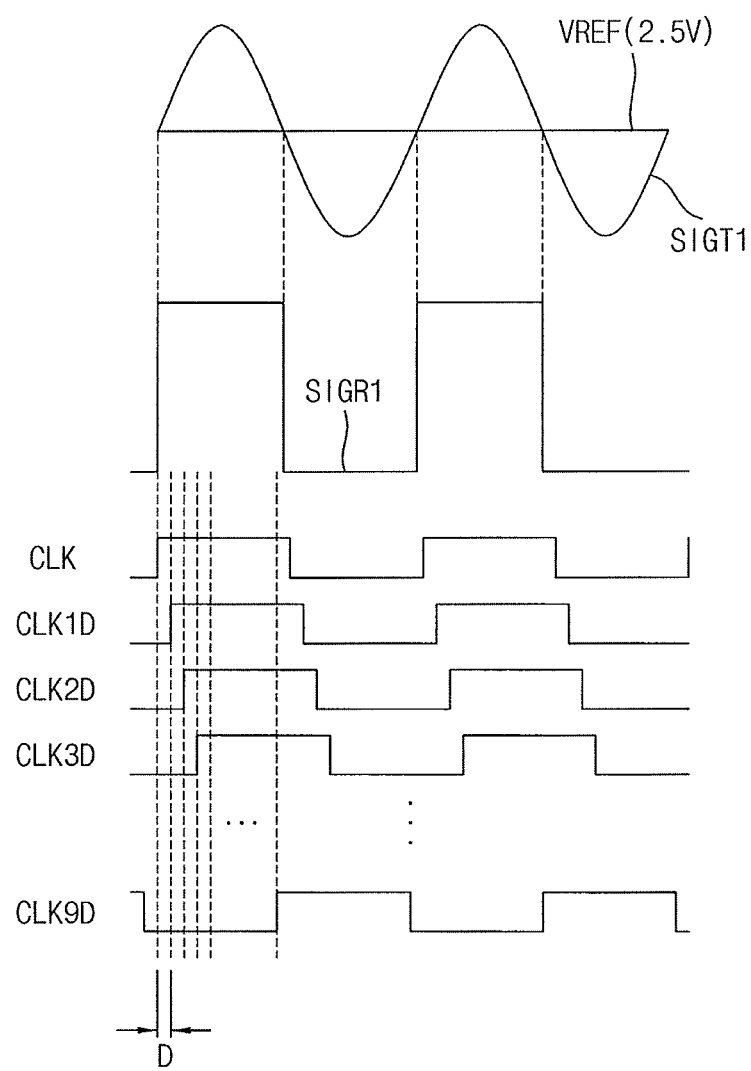
Figure 15:
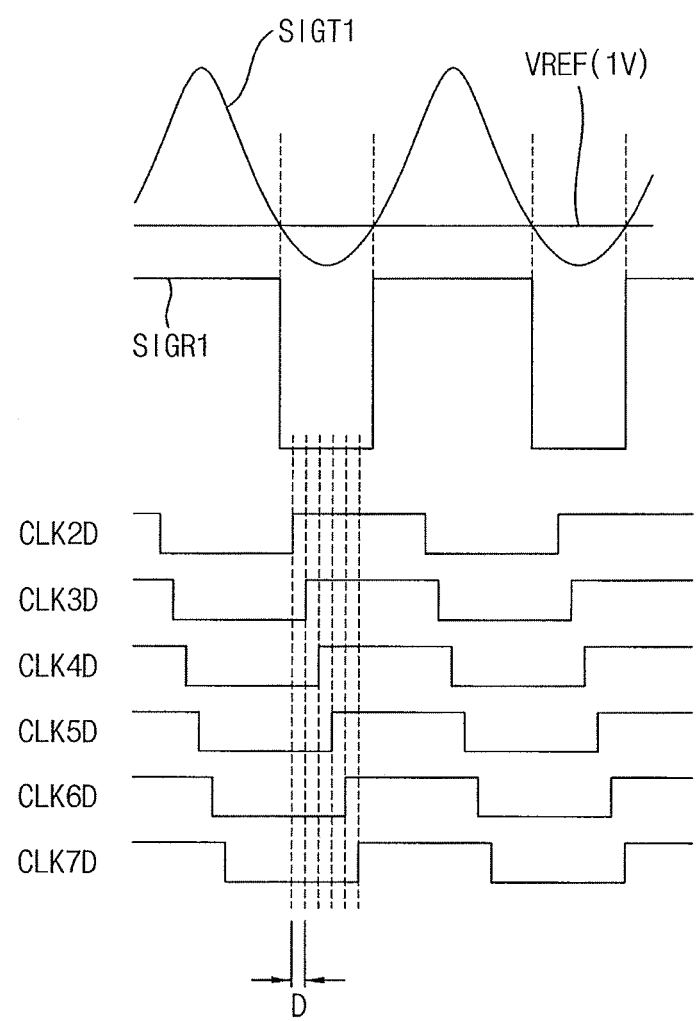

FIGS. 13 through 15 are diagrams illustrating a method of measuring a signal characteristic of the memory system of FIG. 11.

In FIGS. 13 through 15, the processor 510 generates the delayed clock signals CLK1D through CLK9D by delaying the clock signal CLK by the unit delay time D as illustrated in FIG. 14. A phase difference between the clock signal CLK and the ninth delayed clock signal CLK9D is 180 degrees.

FIG. 13 is a diagram illustrating a method of measuring the signal characteristic when 4 (V) is the reference voltage signal VREF, which is larger than an average value of the signal amplitude T×V.

The processor 510 checks whether the first buffer 540 recovers a valid data when the clock signal CLK is transferred to the memory device 530 through the clock signal line 521. The processor 510 checks whether the first buffer 540 recovers a valid data when the first delayed clock signal CLK1D is transferred to the memory device 530 through the clock signal line 521. The procedure is repeated for each of the delayed clock signals CLK2D through CLK9D.

In FIG. 13, the first buffer 540 recovers a valid data for the second through seventh delayed clock signals CLK2D through CLK7D.

FIG. 14 is a diagram illustrating a method of measuring a signal characteristic when 2.5 (V) is the reference voltage signal VREF, which is the average value of the signal amplitude T×V. In an exemplary embodiment of the inventive concept, the first buffer 540 recovers valid data for the clock signal CLK and the first through ninth delayed clock signals CLK1D through CLK9D.

FIG. 15 is a diagram illustrating a method of measuring a signal characteristic when 1 (V) is the reference voltage signal VREF, which is less than the average value of the signal amplitude T×V. In an exemplary embodiment of the inventive concept, the first buffer 540 recovers a valid data for the second through seventh delayed clock signals CLK2D through CLK7D.

Figure 16:
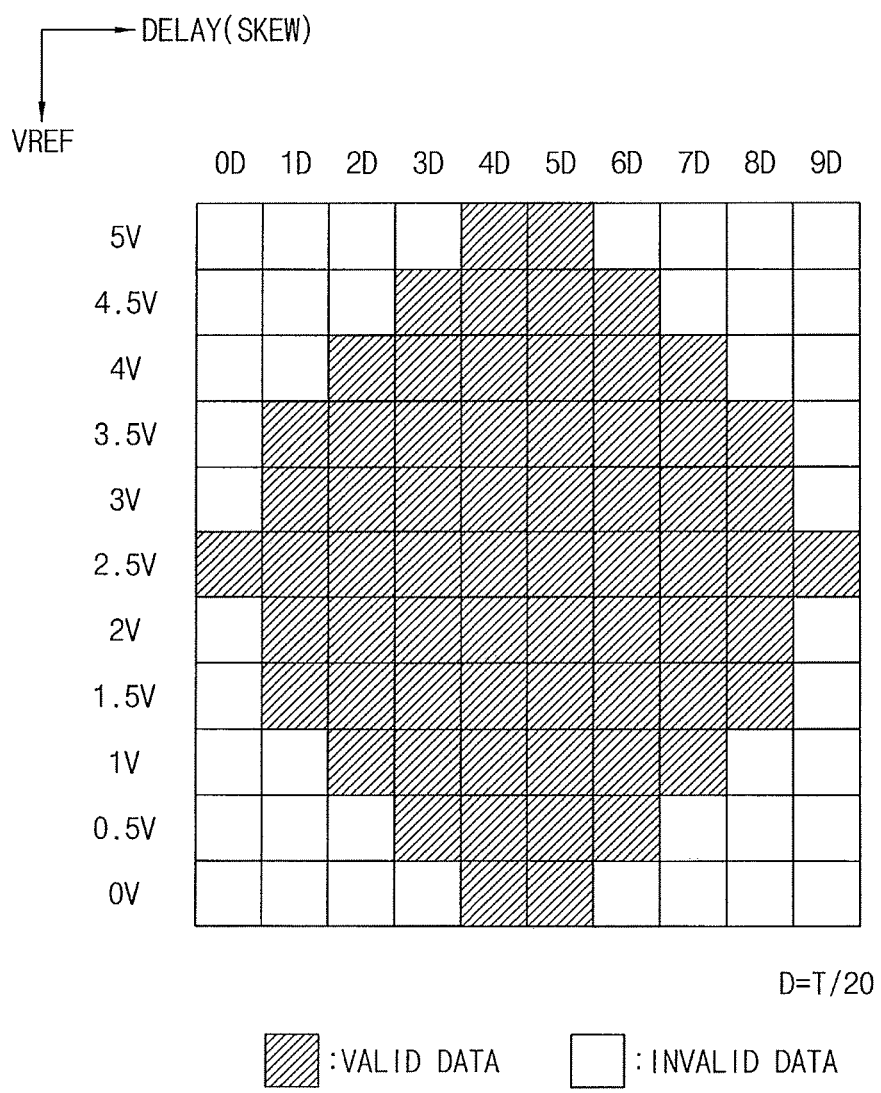
FIG. 16 is an eye diagram of signals from the memory system of FIG. 11.

FIG. 16 is an eye diagram of the signals received by the memory system of FIG. 11.

FIG. 16 shows an eye diagram obtained by repeating the process described above with reference to FIGS. 13 through 15 through changing the reference voltage signal VREF from 0 (V) to 5 (V).

Figure 17:
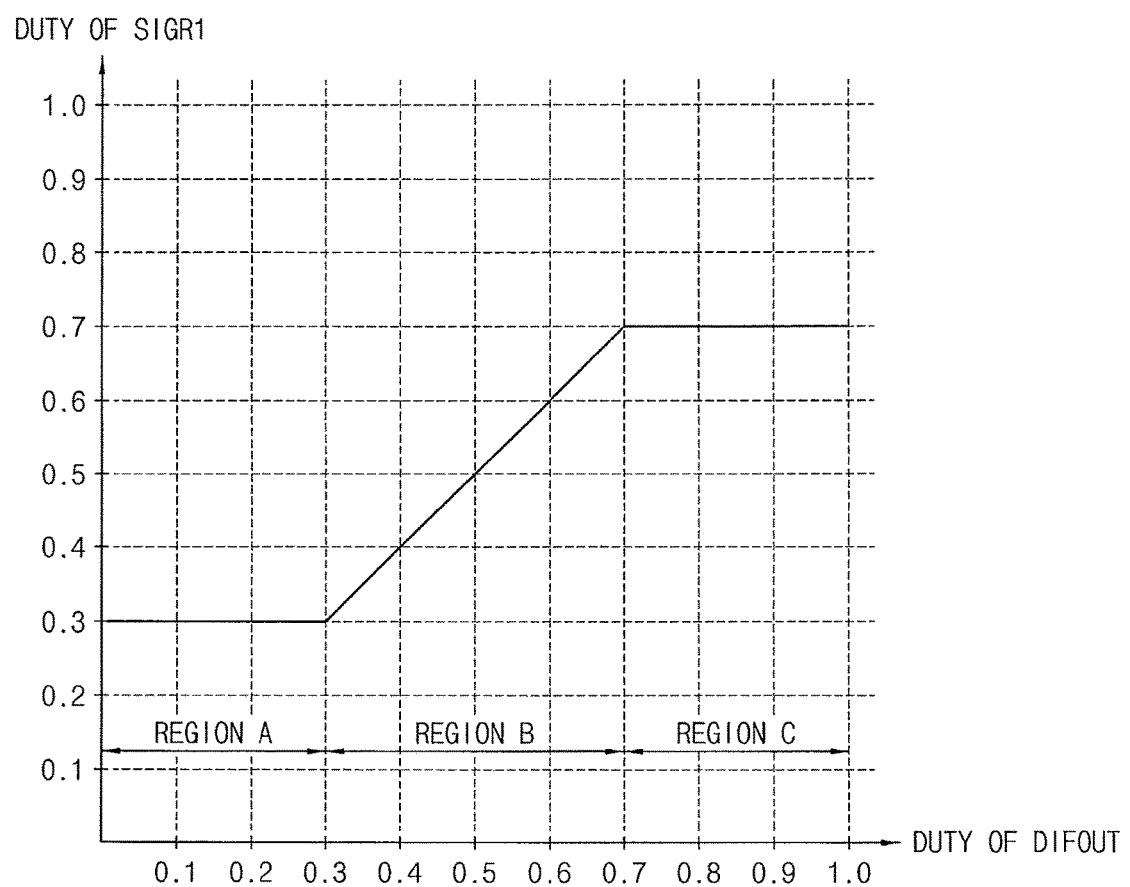
FIG. 17 is a graph illustrating a duty characteristic of the input/output signal of a pulse width widener according to an exemplary embodiment of the inventive concept.

FIG. 17 is a graph illustrating duty characteristic of input/output signal of the pulse width widener included in the first buffer of FIG. 12.

FIG. 17 shows a case that the delay time DELAY of the pulse width widener 552 is fixed at 30% of a period.

In a region A, because the duty of the compared output signal DIFOUT is less than 30% (in other words, the width of a rising pulse of the first received signal SIGT1 is smaller than the delay time DELAY), the pulse width widener 552 sets the width of the rising pulse as the delay time DELAY.

In a region C, because the duty of the compared output signal DIFOUT is larger than 70% (in other words, width of falling pulse of the first received signal SIGT1 is smaller than the delay time DELAY), the pulse width widener 552 sets the width of the falling pulse as the delay time DELAY.

In a region B, because the duty of the compared output signal DIFOUT is larger than 30% and less than 70%, the width of a pulse included in the first received signal SIGT1 is not modified.

Figure 18:
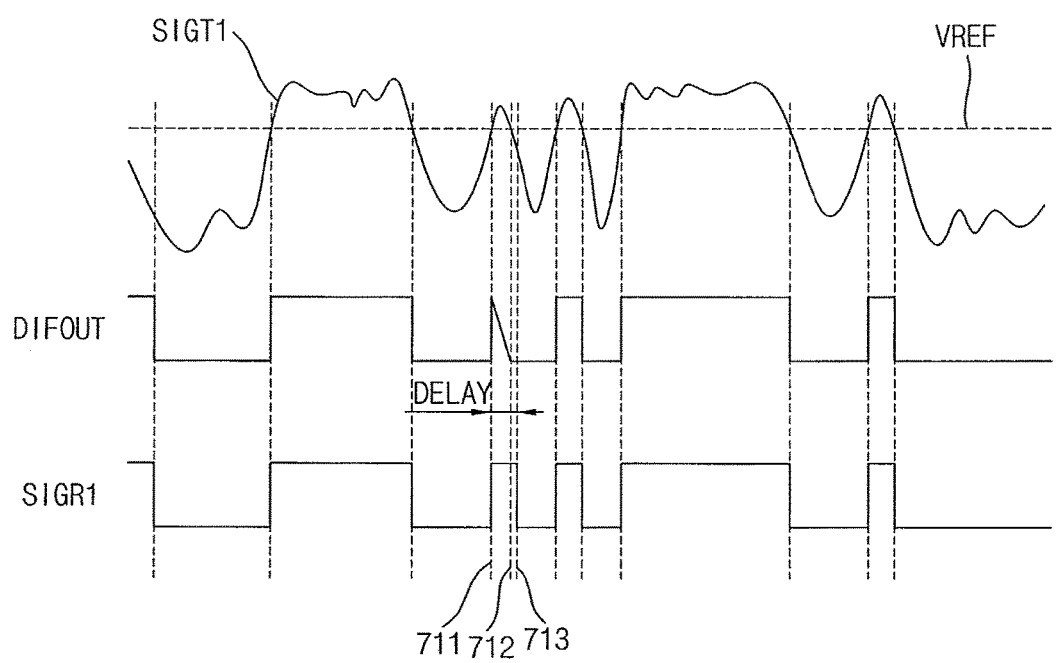
FIGS. 18 and 19 are timing diagrams illustrating an exemplary operation of the first buffer of FIG. 12.
Figure 19:
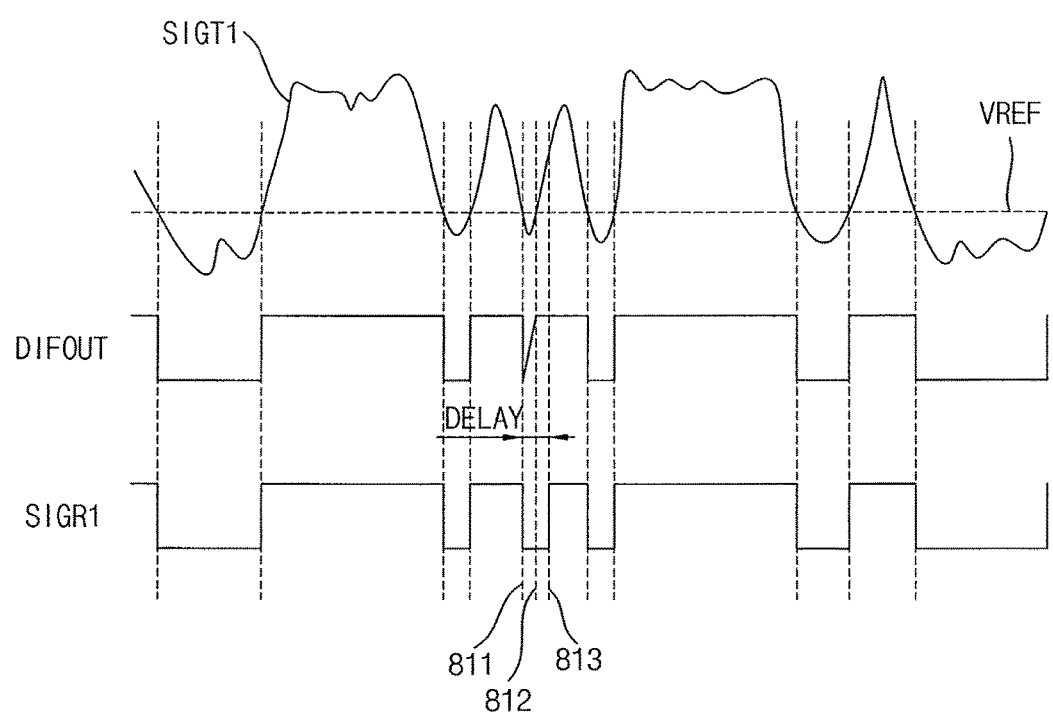

FIGS. 18 and 19 are timing diagrams illustrating operation of the first buffer of FIG. 12.

Referring to FIG. 18, when the first pulse 711~712 of the compared output signal DIFOUT is smaller than the delay time DELAY 711~713, the pulse width widener 552 generates the second pulse 711~713 of the first recovered signal SIGR1 by extending the first pulse 711~712 of the compared output signal DIFOUT.

Other pulses than the first pulse 711~712 included in the compared output signal DIFOUT are not extended because the widths are larger than the delay time DELAY.

Referring to FIG. 19, when the first pulse 811~812 of the compared output signal DIFOUT is smaller than the delay time DELAY 811~813, the pulse width widener 552 generates the second pulse 811~813 of the first recovered signal SIGR1 by extending the first pulse 811~812 of the compared output signal DIFOUT.

Other pulses than the first pulse 811~812 included in the compared output signal DIFOUT are not extended because the widths are larger than the delay time DELAY.

Figure 20:
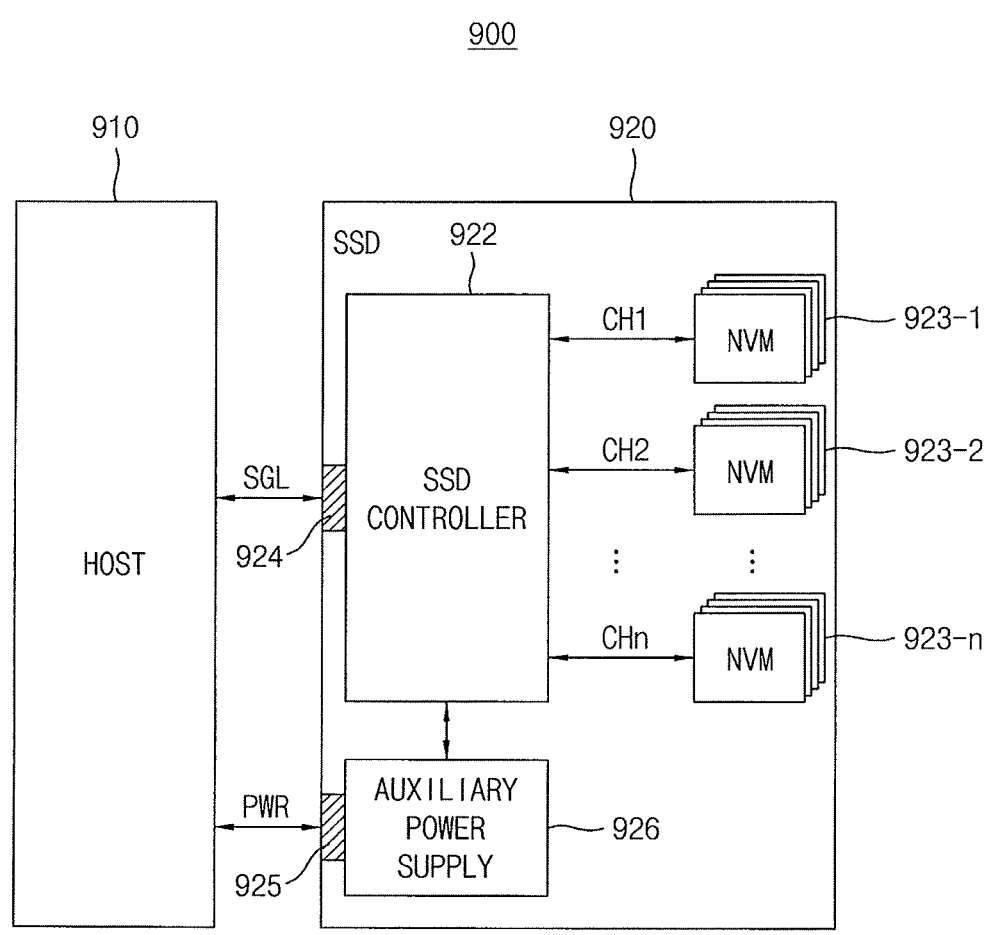
FIG. 20 is a block diagram illustrating a solid state drive system according to an exemplary embodiment of the inventive concept.

FIG. 20 is a block diagram illustrating a solid state drive system according to an example embodiment.

Referring to FIG. 20, an SSD system 900 includes a host 910 and an SSD 920. The SSD 920 includes first through n-th non-volatile memory devices 923-1, 923-2, ..., 923-n and a SSD controller 922. Here, n represents an integer greater than or equal to two. The first through n-th non-volatile memory devices 923-1, 923-2, ..., 923-n may be used as a storage medium of the SSD 920.

Each of the first through n-th non-volatile memory devices 923-1, 923-2, ..., 923-n may include a memory cell array formed on a substrate in a three-dimensional structure. Memory cells included in the memory cell array may be formed in a direction perpendicular to the substrate. The memory cells included in the memory cell array may be connected to a plurality of word lines, which are stacked in a direction perpendicular to the substrate, and a plurality of bit lines, which are formed in a direction parallel to the substrate.

The SSD controller 922 is coupled to the first through n-th non-volatile memory devices 923-1, 923-2, ..., 923-n by first through n-th channels CH1, CH2, ..., CHn, respectively.

The SSD controller 922 may exchange a signal SGL with the host 910 through a signal connector 924. The signal SGL may include a command, an address and data. The SSD controller 922 may perform a program operation and a read operation on the first through n-th non-volatile memory devices 923-1, 923-2, ..., 923-n according to the command received from the host 910.

The SSD 920 may further include an auxiliary power supply 926. The auxiliary power supply 926 may receive power PWR from the host 910 through a power connector 925 and provide power to the SSD controller 922. The auxiliary power supply 926 may be placed inside or outside the SSD 920. For example, the auxiliary power supply 926 may be integrated in a main board and provide auxiliary power to the SSD 920.

Figure 21:
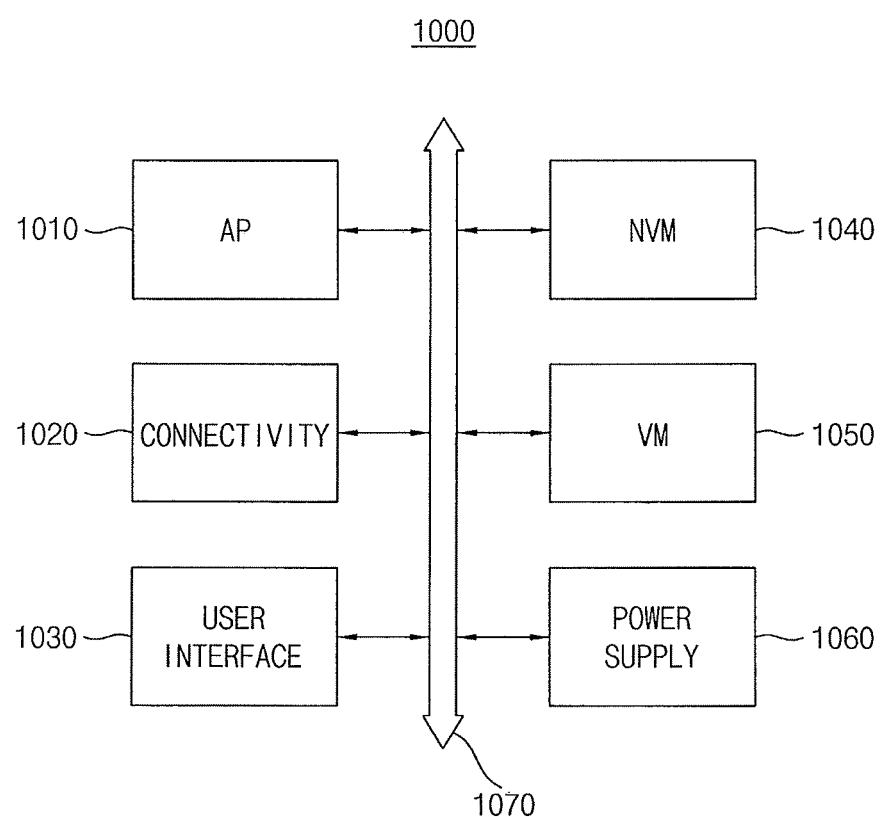
FIG. 21 is a block diagram illustrating a mobile system according to an exemplary embodiment of the inventive concept.

FIG. 21 is a block diagram illustrating a mobile system according to an example embodiment.

Referring to FIG. 21, a mobile system 1000 includes an application processor AP 1010, a connectivity unit 1020, a user interface 1030, a non-volatile memory device NVM 1040, a volatile memory device VM 1050 and a power supply 1060.

In some exemplary embodiments of the inventive concept, the mobile system 1000 may be a mobile phone, a smart phone, a personal digital assistant (PDA), a portable multimedia player (PMP), a digital camera, a music player, a portable game console, a navigation system, etc.

The application processor AP 1010 may execute applications, such as a web browser, a game application, a video player, etc. In an exemplary embodiment of the inventive concept, the application processor AP 1010 may include a single core or multiple cores. For example, the application processor AP 1010 may be a multi-core processor, such as a dual-core processor, a quad-core processor, a hexa-core processor, etc. The application processor AP 1010 may include an internal or external cache memory.

The connectivity unit 1020 may perform wired or wireless communication with an external device. For example, the connectivity unit 20 may perform Ethernet communication, near field communication (NFC), radio frequency identification (RFID) communication, mobile telecommunication, memory card communication, universal serial bus (USB) communication, etc. In an exemplary embodiment of the inventive concept, the connectivity unit 1020 may include a baseband chipset that supports communications, such as global system for mobile communications (GSM), general packet radio service (GPRS), wideband code division multiple access (WCDMA), high speed downlink/uplink packet access (HSxPA), etc.

The non-volatile memory device 1040 may store a boot image for booting the mobile system 1000.

The non-volatile memory device 1040 may include a memory cell array formed on a substrate in a three-dimensional structure. Memory cells included in the memory cell array may be formed in a direction perpendicular to the substrate. The memory cells included in the memory cell array may be connected to a plurality of word lines, which are stacked in a direction perpendicular to the substrate, and a plurality of bit lines, which are formed in a direction parallel to the substrate.

The volatile memory device 1050 may store data processed by the application processor AP 1010, or may operate as a working memory.

The user interface 1030 may include at least one input device, such as a keypad, a touch screen, etc., and at least one output device, such as a speaker, a display device, etc.

The power supply 1060 may supply a power supply voltage to the mobile system 1000.

In some embodiments, the mobile system 1000 may further include an image processor, or a storage device, such as a memory card, a solid state drive (SSD), a hard disk drive (HDD), a CD-ROM, etc.

In some embodiments, the mobile system 1000 or components of the mobile system 1000 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 22:
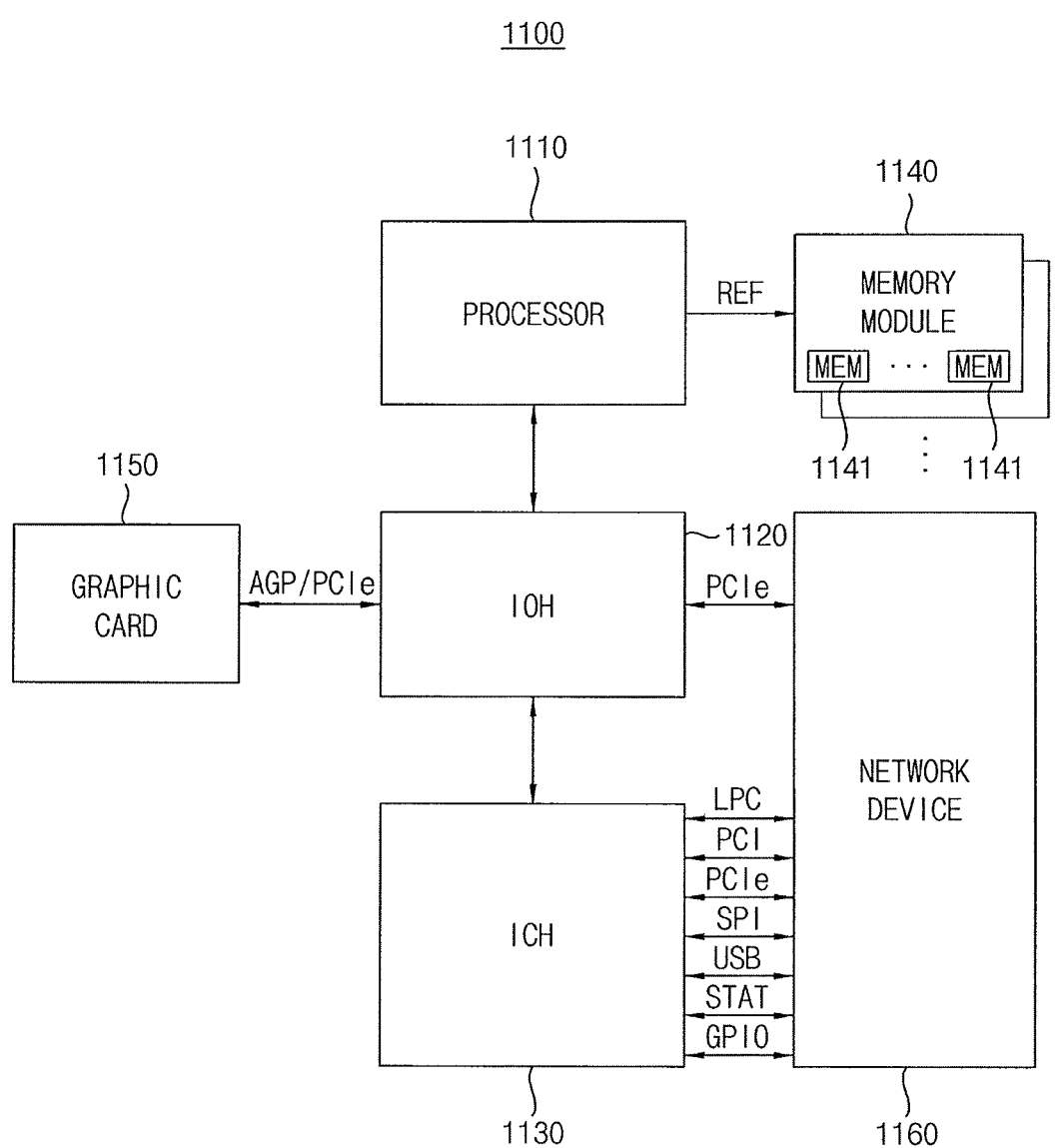
FIG. 22 is a block diagram illustrating a computing system according to an exemplary embodiment of the inventive concept.

FIG. 22 is a block diagram illustrating a computing system according to an example embodiment.

Referring to FIG. 22, a computing system 1100 includes a processor 1110, an input/output hub (IOH) 1120, an input/output controller hub (ICH) 1130, at least one memory module 1140, a network device 1160 and a graphics card 1150. In some embodiments, the computing system 1100 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 1110 may perform various computing functions, such as executing software for performing calculations or tasks. For example, the processor 1110 may be a microprocessor, a central process unit (CPU), a digital signal processor, or the like. In some embodiments, the processor 1110 may include a single core or multiple cores. For example, the processor 1110 may be a multi-core processor, such as a dual-core processor, a quad-core processor, a hexa-core processor, etc. Although FIG. 22 illustrates the computing system 1100 including one processor 1110, in some embodiments, the computing system 1100 may include a plurality of processors.

The processor 1110 may include a memory controller for controlling operations of the memory module 1140. The memory controller included in the processor 1110 may be referred to as an integrated memory controller (IMC). A memory interface REF between the memory controller and the memory module 1140 may be implemented with a single channel including a plurality of signal lines, or may bay be implemented with multiple channels, to each of which at least one memory module 1140 may be coupled. In some embodiments, the memory controller may be located inside the input/output hub IOH 1120. The input/output hub IOH 1120 including the memory controller may be referred to as memory controller hub (MCH).

The memory module 1140 may include a plurality of memory devices 1141 that store data provided from the memory controller. The processor 1110 may employ the processor 510 in FIG. 11, the memory interface REF may correspond to the channel 520 in FIG. 11, and the memory module 1140 may correspond to the memory device 530 in FIG. 11. In some embodiments, each of the processor 1110, the input/output hub 1120, the input/output controller hub 1130, the memory module 1140, the network device 1160 and the graphics card 1150 may employ the pulse width wider of FIG. 1 for enhancing signal characteristic of a received signal.

The input/output hub 1120 may manage data transfer between processor 1110 and devices, such as the graphics card 1150. The input/output hub 1120 may be coupled to the processor 1110 via various interfaces. For example, the interface between the processor 1110 and the input/output hub IOH 1120 may be a front side bus (FSB), a system bus, a HyperTransport, a lightning data transport (LDT), a Quick-Path interconnect (QPI), a common system interface (CSI), etc. The input/output hub IOH 1120 may provide various interfaces with the devices. For example, the input/output hub IOH 1120 may provide an accelerated graphics port (AGP) interface, a peripheral component interface-express (PCIe), a communications streaming architecture (CSA) interface, etc.

The graphics card 1150 may be coupled to the input/output hub 1120 via AGP or PCIe. The graphics card 1150 may control a display device for displaying an image. The graphics card 1150 may include an internal processor for processing image data and an internal memory device. In some embodiments, the input/output hub 1120 may include an internal graphics device along with or instead of the graphics card 1150 outside the graphics card 1150. The graphics device included in the input/output hub 1120 may be referred to as an integrated graphics device. Further, the input/output hub 1120 including the internal memory controller and the internal graphics device may be referred to as a graphics and memory controller hub (GMCH).

The input/output controller hub 1130 may perform data buffering and interface arbitration to efficiently operate various system interfaces. The input/output controller hub 1130 may be coupled to the input/output hub 1120 via an internal bus, such as a direct media interface (DMI), a hub interface, an enterprise Southbridge interface (ESI), PCIe, etc.

The input/output controller hub 1130 may provide various interfaces with peripheral devices. For example, the input/output controller hub 330 may provide a universal serial bus (USB) port, a serial advanced technology attachment (SATA) port, a general purpose input/output (GPIO), a low pin count (LPC) bus, a serial peripheral interface (SPI), PCI, PCIe, etc.

The network device 1160 may receive data from the processor 1110 and the graphics card 1150 through the PCI express of the input/output hub 1120 or one of the USB port, the SATA port, the GPIO, the LPC bus, the SPI, the PCI, and the PCIe. The network device 1160 may transmit the data to the other computing system. The network device 1160 may receive other data from the other computing system.

In an exemplary embodiment of the inventive concept, the processor 1110, the input/output hub 1120 and the input/output controller hub 1130 may be implemented as separate chipsets or separate integrated circuits. In an exemplary embodiment of the inventive concept, at least two of the processor 1110, the input/output hub 1120 and the input/output controller hub 1130 may be implemented as a single chipset.

The foregoing is illustrative of example embodiments and is not to be construed as limiting thereof. Although a few example embodiments have been described, those skilled in the art will readily appreciate that many modifications are possible in the example embodiments without materially departing from the novel teachings of the present inventive concept. Accordingly, such modifications are intended to be included within the scope of the present inventive concept as disclosed in the claims. Therefore, it is to be understood that the foregoing is illustrative of various exemplary embodiments of the inventive concept and is not to be construed as limited to the exemplary embodiments disclosed.

What is claimed is:

1. A pulse width widener comprising:
    a delay circuit configured to generate a first signal by delaying a first pulse of an input signal by a delay time;
    a processing circuit configured to generate a second signal, the second signal including information of a second pulse that is temporally extended from the first pulse when a width of the first pulse is smaller than the delay time; and
    a latch circuit configured to store the second signal and configured to output the second pulse as an output signal.

2. The pulse width widener of claim 1, wherein a width of the second pulse is the same as the delay time.

3. The pulse width widener of claim 1, wherein the processing circuit generates the second signal including information of a third pulse when the input signal includes the third pulse and a width of the third pulse is equal to or larger than the delay time.

4. The pulse width widener of claim 1, wherein the delay time is fixed.

5. The pulse width widener of claim 1, wherein the delay time is modified by a user.

6. The pulse width widener of claim 1, wherein the first pulse is a portion of the input signal and the portion is from a first time point of the input signal, at the first time point the input signal moves from an activation level to a deactivation level, to a second time point of the input signal, at the second time point the input signal moves from the deactivation level to the activation level after the width of the first pulse from the first time point.

7. The pulse width widener of claim 1, wherein the first pulse is a portion of the input signal and the portion is from a first time point of the input signal, at the first time point the input signal moves from a deactivation level to an activation level, to a second time point of the input signal, at the second time point the input signal moves from the activation level to the deactivation level after the width of the first pulse from the first time point.

8. The pulse width widener of claim 1, wherein the processing circuit includes a NMOS transistor and an exclusive NOR gate,
wherein a first input terminal of the exclusive NOR gate receives the first signal, a second input terminal of the exclusive NOR gate receives the second signal, and an output terminal of the exclusive NOR gate outputs an enable signal, and
wherein a source of the NMOS transistor receives the input signal, a gate of the NMOS transistor receives the enable signal, and a drain of the NMOS transistor outputs the second signal.

9. The pulse width widener of claim 1, wherein the processing circuit includes a NMOS transistor, a PMOS transistor, an exclusive NOR gate, and an inverter,
wherein a first input terminal of the exclusive NOR gate receives the first signal, a second input terminal of the exclusive NOR gate receives the second signal, and an output terminal of the exclusive NOR gate outputs an enable signal,
wherein an input terminal of the inverter receives the enable signal and an output terminal of the inverter outputs an inverted enable signal,
wherein the input signal is provided to a first node,
wherein a source of the NMOS transistor is connected to the first node, a gate of the NMOS transistor receives the enable signal, and a drain of the NMOS transistor is connected to a second node,
wherein a source of the PMOS transistor is connected to the first node, a gate of the PMOS transistor receives the inverted enable signal, and a drain of the PMOS transistor is connected to the second node, and
wherein the second signal is outputted from the second node.

10. The pulse width widener of claim 1, wherein the processing circuit includes a PMOS transistor and an exclusive OR gate,
wherein a first input terminal of the exclusive OR gate receives the first signal, a second input terminal of the exclusive OR gate receives the second signal, and an output terminal of the exclusive OR gate outputs an enable signal, and
wherein a source of the PMOS transistor receives the input signal, a gate of the PMOS transistor receives the enable signal, and a drain of the PMOS transistor outputs the second signal.

11. The pulse width widener of claim 1, wherein the processing circuit includes a NMOS transistor, a PMOS transistor, an exclusive OR gate, and an inverter,
wherein a first input terminal of the exclusive OR gate receives the first signal, a second input terminal of the exclusive OR gate receives the second signal, and an output terminal of the exclusive OR gate outputs an enable signal,
wherein an input terminal of the inverter receives the enable signal and an output terminal of the inverter outputs an inverted enable signal,
wherein the input signal is provided to a first node,
wherein a source of the PMOS transistor is connected to the first node, a gate of the PMOS transistor receives the enable signal, and a drain of the PMOS transistor is connected to a second node,
wherein a source of the NMOS transistor is connected to the first node, a gate of the NMOS transistor receives the inverted enable signal, and a drain of the NMOS transistor is connected to the second node, and
wherein the second signal is outputted from the second node.

12. The pulse width widener of claim 1, wherein the latch circuit includes a first inverter, a second inverter, and a third inverter,
wherein the second signal is provided to a first node,
wherein an input terminal of the first inverter is connected to the first node and an output terminal of the first inverter is connected to a second node,
wherein an input terminal of the second inverter is connected to the second node and an output terminal of the second inverter is connected to the first node, and
wherein an input terminal of the third inverter is connected to the second node and an output terminal of the third inverter outputs the output signal.

13. The pulse width widener of claim 1, wherein the latch circuit includes an inverter, a first NOR gate, and a second NOR gate,
wherein the second signal is provided to a first node,
wherein an input terminal of the inverter is connected to the first node and an output terminal of the inverter is connected to a second node,
wherein a first input terminal of the first NOR gate is connected to the second node, a second input terminal of the first NOR gate is connected to a third node, and an output terminal of the first NOR gate is connected to a fourth node,
wherein a first input terminal of the second NOR gate is connected to the fourth node, a second input terminal of the second NOR gate is connected to the first node, and an output terminal of the second NOR gate is connected to the third node, and
wherein the output signal is outputted from the fourth node.

14. A memory system comprising:
a processor configured to generate first through (N)-th signals;
a channel including signal lines that transfer the first through (N)-th signals;
a first through (N)-th buffers configured to receive the first through (N)-th signals as first through (N)-th received signals; and
a memory device including the first through (N)-th buffers and a memory circuit operating based on first through (N)-th recovered signals,
wherein the first through (N)-th buffers generate the first through (N)-th recovered signals respectively by comparing the first through (N)-th received signals and a reference voltage signal,
wherein N is a natural number greater than one, and
wherein a (K)-th buffer includes:
a (K)-th comparator configured to generate a (K)-th compared output signal by comparing the (K)-th received signal and the reference voltage signal, the (K)-th compared output signal includes a pulse and the pulse has a width smaller than a delay time; and
a (K)-th pulse width widener configured to generate the (K)-th recovered signal by extending the pulse,
wherein K is a natural number equal to or less than N.

15. The memory system of claim 14, wherein the (K)-th pulse width widener includes:

a (K)-th delay circuit configured to generate a first pulse signal by delaying the (K)-th compared output signal including a first pulse by the delay time;

a (K)-th processing circuit configured to generate a second pulse signal, the second pulse signal including information of a second pulse that is temporally extended from the first pulse when a width of the first pulse is smaller than the delay time, based on the first and second pulse signals; and a (K)-th latch circuit configured to store the second pulse signal, and configured to output the stored second pulse signal as the (K)-th recovered signal.

16. A memory system comprising:

a processor configured to transmit a clock signal to a memory circuit;

a first through (N)-th signal lines configured to transfer first through (N)-th signals from the processor to a first through (N)-th buffers;

the first through (N)-th buffers configured to generate first through (N)-th recovered signals by comparing the first through (N)-th signals and a reference voltage signal, and the memory circuit configured to store the first through (N)-th recovered signals in response to the clock signal, wherein N is a natural number greater than 1, wherein at least one of the first through (N)-th buffers includes, a comparator configured to generate a compared output signal by comparing one of the first through (N)-th signals and the reference voltage signal, the compared output signal includes a pulse and the pulse has a width smaller than a delay time; and a pulse width widener configured to generate one of the first through (N)-th recovered signals by extending the pulse.

17. The memory system of claim 16, wherein the pulse width widener includes a delay circuit configured to generate a first pulse signal by delaying the compared output signal including a first pulse by the delay time, a processing circuit configured to generate a second pulse signal, the second pulse signal including information of a second pulse that is temporally extended from the first pulse when a width of the first pulse is smaller than the delay time, in response to the first and second pulse signals, and a storage circuit configured to store the second pulse signal, and configured to output the second pulse as an output signal.

18. The memory system of claim 16, wherein the processor configured to generate a first through (M)-th delayed clock signals by delaying the clock signal by a first through (M)-th wait times and transmit the first through (M)-th delayed clock signals to the memory circuit, the processor is configured to determine whether the first through (N)-th buffers recover valid first through (N)-th recovered signals when the memory circuit receives the first through (M)-th delayed clock signals, and wherein M is a natural number greater than 1.

19. The memory system of claim 16, wherein the pulse width widener is edge triggered.

* * * * *